United States Patent [19]
Buynoski

[11] Patent Number: 5,864,160
[45] Date of Patent: Jan. 26, 1999

[54] TRANSISTOR DEVICE WITH REDUCED HOT CARRIER INJECTION EFFECTS

[75] Inventor: Matthew S. Buynoski, Palo Alto, Calif.

[73] Assignee: Advanced Micro Devices, Inc., Sunnyvale, Calif.

[21] Appl. No.: 653,147

[22] Filed: May 24, 1996

[51] Int. Cl.[6] ............ H01L 29/76; H01L 23/62; H01L 21/336
[52] U.S. Cl. .......... 257/339; 257/336; 257/339; 257/344; 257/356; 257/382; 257/384; 257/408; 257/410; 438/287; 438/421; 438/422
[58] Field of Search .................. 257/336, 339, 257/344, 382, 384, 408, 356, 410; 438/287, 421, 422

[56] References Cited

U.S. PATENT DOCUMENTS

| | | | |
|---|---|---|---|
| 5,159,416 | 10/1992 | Kudoh | 257/384 |
| 5,183,771 | 2/1993 | Mitsui et al. | 257/384 |
| 5,369,297 | 11/1994 | Kusunoki et al. | 257/344 |
| 5,536,971 | 7/1996 | Oishi et al. | 257/410 |
| 5,648,673 | 7/1997 | Yasuda | 257/382 |

FOREIGN PATENT DOCUMENTS

| | | | |
|---|---|---|---|
| 363177469 | 7/1988 | Japan | 257/410 |
| 406151833 | 5/1994 | Japan | 257/410 |

OTHER PUBLICATIONS

MacWilliams et al.; Improved Hot–Carrier Resistance with Fluorinated Gate Oxides; IEEE Electron Device Letter, vol. 11, No. 1, pp. 3–5. Jan. 1990.

*Primary Examiner*—Mahshid D. Saadat
*Assistant Examiner*—Ida M. Soward

[57] ABSTRACT

A MOS transistor includes a void space as part of the gate oxide layer on the drain end of the transistor. The void space replaces a region of the gate oxide layer so that no oxide is present for injection of hot carriers. The presence of the void space, preferably containing a vacuum, also reduces the total gate capacitance of the device. The void space is formed by chemical etching of the gate oxide layer and void space sealing during device manufacture.

20 Claims, 2 Drawing Sheets

TRANSISTOR DEVICE WITH REDUCED HOT CARRIER INJECTION EFFECTS

FIELD OF THE INVENTION

The present invention is directed to a MOS transistor and a method of making and, in particular, to a MOS transistor which has lowered gate capacitance and reduced hot carrier injection induced damage.

BACKGROUND ART

Referring to FIG. 1, a conventional MOS transistor is generally designated by the reference numeral 10 and is seen to include a source region, drain region and a gate region. The gate region includes a polysilicon layer 1, a gate oxide layer 3 and an oxide spacer 5. The transistor 10 also includes a substrate 7 having source/drain diffusion regions 9 and lightly doped drain structures 11. A silicide layer 13 is formed on top of the polysilicon layer 1 and source/drain diffusion regions 9. A field oxide region 15 is located adjacent the source and drain regions.

The substrate 7 also includes a depletion region 17 and a region 19 where hot carrier injection induced damage can occur. This hot carrier injection problem can arise when the device dimensions are reduced but the supply voltage is maintained constant. This results in an increase in the electric field generated in the silicon. The intensified electric field can the make it possible for electrons in the channel of the transistor to gain sufficient energy to be injected into the gate oxide. The charging of the gate oxide causes a long term device degradation, which raises the threshold voltage of the device and reduces its transconductance.

One prior art approach to lower degradation from hot carrier injection induced damage is the use of the lightly doped drain regions 11. The disadvantage of lightly doped drain regions is that they raise the parasitic resistance from the source to the channel and, consequently, lower the current available and reduce the device speed.

The hot carrier injection typically occurs at the drain end of the transistor as shown in FIG. 1, reference numeral 19. Current and threshold voltage are determined mainly at the source/channel interface, i.e. the tip of the source/side LDD and in the inversion channel. Neither of these extends into the area depleted by the drain-body voltage.

The use of lightly doped drain regions to minimize hot carrier injection induced damage is becoming less effective at dimensions below 0.25 microns. Consequently, a need has developed to design an MOS transistor which overcomes the deficiencies noted above in prior art devices.

Ways to increase device speed can be addressed by considering the relationship between the capacitive load being switched, the voltage swing of the switch and device current. Device switching speed can be boosted by either raising current or lowering capacitance.

The present invention overcomes the disadvantages of prior art MOS transistors through the utilization of a void space which eliminates a portion of the gate oxide layer where carriers injected by hot carrier effects lodge. Thus, gate capacitance is lowered and device speed is increased.

SUMMARY OF THE INVENTION

Accordingly, it is a first object of the present invention to provide an improved MOS transistor device.

Another object of the present invention is to provide a MOS transistor having reduced gate capacitance and reduced degradation from hot carrier injection induced damage.

A further object of the present invention is to provide a method of making a MOS transistor having reduced gate capacitance and lower degradation from hot carrier injection induced damage.

Other objects and advantages of the present invention will become apparent as a description thereof proceeds.

In satisfaction of the foregoing objects and advantages, the present invention is an improvement in known MOS transistor devices. In these known devices, a substrate is provided having a source diffusion region and a drain diffusion region spaced therefrom. A gate oxide layer is positioned on a portion of the substrate and is in contact with the source and drain diffusion regions. A gate electrode is positioned over the gate oxide layer. An oxide spacer surrounds the gate electrode and a silicide layer is disposed on top of the gate electrode and source and drain diffusion regions adjacent the oxide spacer.

In accordance with the broadest embodiment of the invention, a portion of the gate oxide layer adjacent a drain of the transistor device is replaced with a void space. The void space lowers hot carrier injection induced damage and the gate capacitance of the transistor.

In an alternative embodiment, the source and drain diffusion regions can include lightly doped drain regions, one of which being positioned beneath the oxide spacer and at least part of the gate oxide layer with the other lightly doped drain region positioned beneath the void space.

The void space can be positioned over a part of the substrate and a portion of either the drain diffusion region or the lightly doped drain region adjacent the drain diffusion region.

The void space, sealed from the atmosphere by the oxide spacer, preferably contains a vacuum, a near vacuum or an inert gas so that no oxygen is present in the void space to cause native oxide regrowth.

In the method aspect of the invention, the MOS transistor is formed according to conventional processing up to the step of gate etching and gate clean up. At this stage in the processing, the polysilicon layer on the gate oxide and the source/diffusion regions have been formed.

A portion of the gate oxide layer beneath the gate electrode and above a portion of the drain diffusion region is removed to form a void space. The void space is then sealed so that it is protected from atmosphere and subsequent oxidation. Conventional processing is then continued to form the remainder of the transistor.

The gate oxide can be removed using any conventional means including masking the appropriate areas of the device and hydrofluoric acid etching the gate oxide out from the transistor drain end. Following a cleaning and resist removal step, a thin deposition of a sealing material such as an oxide, a high temperature silicon nitride or the like is deposited over the device structure, including over the opening formed by the etching of the gate oxide to seal the void space from oxygen. The deposition step is performed in an oxygen free or near vacuum atmosphere in the deposition chamber so that no air enters the void space.

Conventional processing is then continued to form the transistor device. In the case of using a nitride sealant, a nitride removal step is conducted prior to continuing with conventional processing.

BRIEF DESCRIPTION OF THE DRAWINGS

Reference is now made to the drawings of the invention wherein.

DESCRIPTION OF THE PREFERRED EMBODIMENTS

The present invention provides a MOS transistor which has lowered gate capacitance and lower degradation due to hot carrier injection. Since the inventive transistor reduces the hot carrier effect, more current can be sent through the transistor without causing reliability or wearout problems. Thus, the device switching speed can be increased without compromise of transistor performance.

Figure 1:
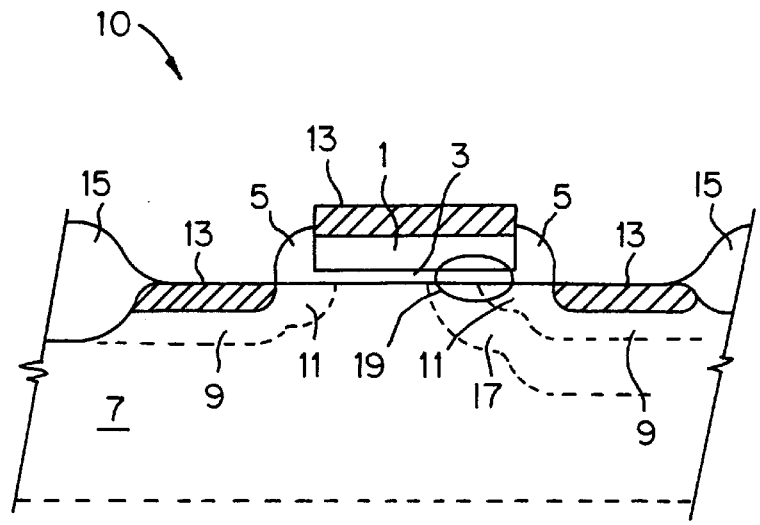
FIG. 1 is a schematic representation of a prior art MOS transistor.
Figure 2:
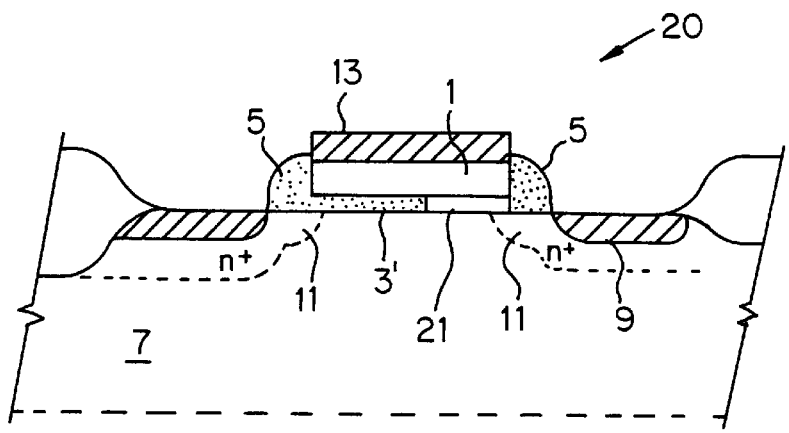
FIG. 2 is a schematic representation of a first embodiment of the inventive transistor.

The improvements associated with the inventive transistor are attained by the formation of a void space in substitution for a portion of the gate oxide layer of a MOS transistor. Referring now to FIG. 2, a first embodiment of the inventive transistor is generally designated by the reference numeral 20. In this embodiment, a void space 21 is provided beneath the polysilicon gate layer 1, above the substrate 7 and lightly doped drain region 11 and adjacent the gate oxide layer 3'. The void space 21 is formed on the drain end of the transistor.

Preferably, the void space 21 contains a vacuum. The presence of a vacuum in the void space 21 reduces the total gate capacitance by reason of the difference in the dielectric constant for a vacuum and normal gate oxide material, e.g., $SiO_2$. The dielectric constant for a vacuum is 1.0 whereas the dielectric constant for $SiO_2$ is 3.9. The exact reduction in the total gate capacitance depends on the gate length and the amount of gate oxide removed in substitution of the void space 21.

Since an oxide is not present in the region where injected hot carriers can arrive at the substrate surface, there can be no damage or holding of a charge. Thus, the hot carrier effect is reduced and more current can be sent through the transistor without causing reliability or wearout problems.

Increases in current can be accomplished by any of several methods. Examples of these methods include adjustment of the implant doses of the source and drain diffusion regions, using narrower gate masking dimensions and raising the lightly doped drain doses.

Figure 3:
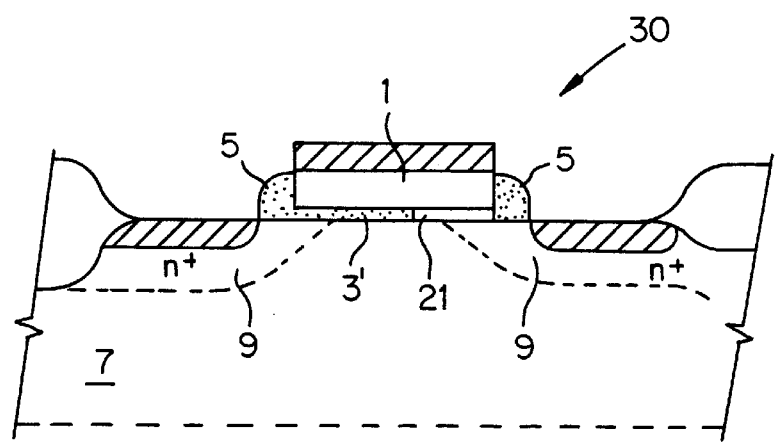
FIG. 3 is a second embodiment of the inventive transistor.

It is also believed that the lightly doped drain region can be eliminated altogether so that the source/drain diffusion regions can be situated directly adjacent the void space. This embodiment is depicted in FIG. 3 and designated by the reference numeral 30. In this figure, one of the source/drain diffusion region 9' is shown directly against the void space 21. This embodiment can be employed if the removal of the gate oxide and formation of the void space 21 is sufficient by itself in lowering hot carrier injection induced problems.

Although a MOS transistor is shown with silicide and source/drain diffusion regions, any known type of MOS transistor construction can be utilized with the invention.

MOS transistors with the formed void space are particularly useful in transistor designs of 0.25 microns or below.

Referring again to FIG. 2, in the broadest embodiment of the method aspect of the invention, the gate oxide 3 must be removed from under the drain side of the gate. While the gate oxide can be removed using any known techniques, a more preferred technique uses chemical etching in a controlled concentration of hydrofluoric acid in water, e.g., 10 parts water to 1 part hydrofluoric acid to 100 parts water to 1 part hydrofluoric acid. The chemical etching is performed for a specific time which is dependent on the dimensions of the transistor and specific length of the drain diffusion and the lightly doped drain diffusion, longer dimensions requiring more etching time. The purpose of the etching is to remove the gate oxide from the region where carriers injected by hot carrier effects may lodge.

Figure 4A:
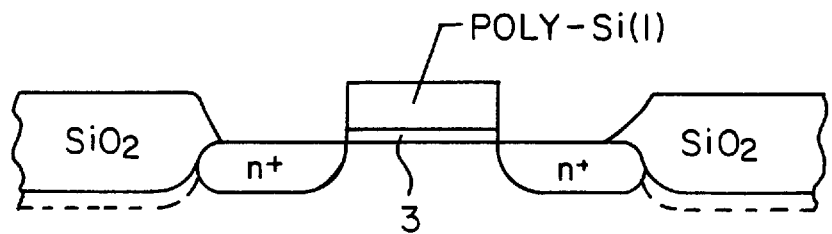
FIGS. 4a–4d depict relevant processing step for making the inventive transistor.

Referring now to FIGS. 4a–4d, the relevant processing steps in formation of a MOS transistor are depicted to permit formation of the void space adjacent the gate oxide layer. FIG. 4a depicts the MOS transistor processing step when the polysilicon gate 1 is formed on the gate oxide layer 3. After gate formation, a clean-up step is performed to clean any resist, anti-reflective coatings and/or etch polymers present.

Figure 4B:
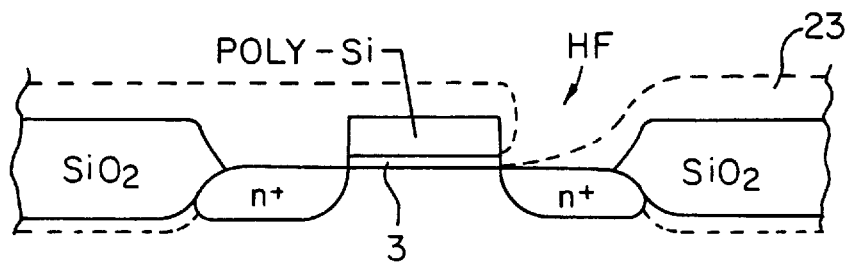

Referring now to FIG. 4b, a mask designated by the reference numeral 23 is formed so as to expose the drain end of the transistor while protecting the source end. The mask may be formed using any conventional materials and/or techniques.

Once the mask is formed, the gate oxide material 3 on the drain end is removed. A preferred method for removing the gate oxide is using a chemical etch. In this mode, it is preferred to use a controlled concentration of hydrofluoric acid in water, a ratio ranging between 10 parts water to 1 part hydrofluoric acid to 100 parts water to 1 part hydrofluoric acid. The etching time is dependent on the dimensions of the transistor and the specific length of the drain diffusion and LDD diffusion, if present. Of course, other chemical etchants could be utilized as are known in the art.

Figure 4C:
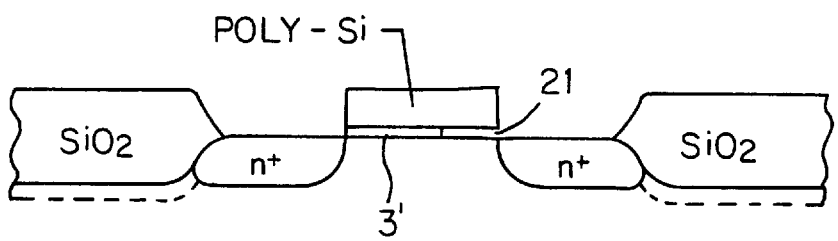

After the etching step is completed and the gate oxide is dissolved from the drain end of the transistor, the mask can be removed, thereby leaving the transistor device in the form depicted in FIG. 4c. Mask removal and cleaning is important since the hydrofluoric solution used to etch the gate oxide will ruin the device if any residual amounts are left on the device. Thus, the solution must be removed completely. Complete removal is preferably done using a hot vacuum. Mask removal is preferably conducted in a relatively non-oxidizing solution such as sulfuric acid without peroxide or any of the other solvent cleans conventionally available.

Since the gate oxide layer is very thin, it is important that the void space created by removal of the gate oxide be promptly sealed. Otherwise, native oxide regrowth can occur so as to reconstitute a substantial portion of the removed oxide.

Figure 4D:
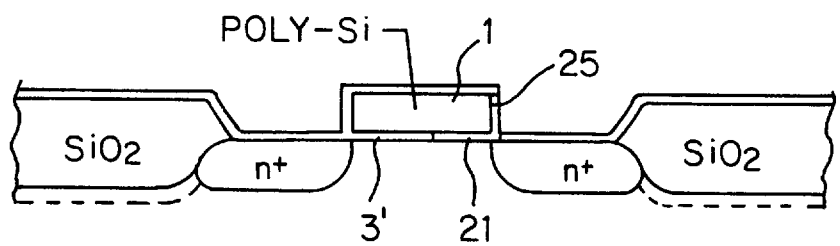

In a preferred mode, the void space depicted in FIG. 4c is sealed using a vacuum sealing technique. More specifically, a thin deposition of an oxide or high temperature silicon nitride is formed over the device including the void space where it opens into atmosphere. The deposition of the sealing layer is achieved by subjecting the device to near-vacuum in the deposition chamber. Deposition of the oxide or nitride serves to isolate the void space from atmospheric air so as to prevent regrowth of the oxide from either the substrate or the polysilicon of the gate layer. The thickness of the sealing layer should be kept fairly thin, no more than 1000 Angstroms and preferably no more than 500 Angstroms since these thicknesses are sufficient to isolate the void space from atmosphere. FIG. 4d depicts the device with the sealing layer 25 formed thereon.

After the sealing layer is formed, the device is subjected to conventional processing if the sealing layer is an oxide material. If a nitride is used as the sealing layer, a nitride removal step such as a nitride spacer etch is performed on any nitride-containing flat surfaces.

Since the remaining conventional processing for the device manufacture is well known, a further description thereof is not deemed necessary for understanding of the invention.

It should be understood that although chemical etching is disclosed for removal of the portion of the gate oxide beneath the polysilicon gate, other known techniques for oxide removal can also be employed as part of the inventive method.

As such, an invention has been disclosed in terms of preferred embodiments thereof which fulfill each and every one of the objects of the present invention as set forth hereinabove and provides a new and improved MOS transistor and method of making.

Of course, various changes, modifications and alterations from the teachings of the present invention may be contemplated by those skilled in the art without departing from the intended spirit and scope thereof. Accordingly, it is intended that the present invention only be limited by the terms of the appended claims.

I claim:

1. A transistor device comprising:
   a) a substrate having a source diffusion region and a drain diffusion region spaced from the source diffusion region;
   b) a gate oxide layer positioned on a portion of said substrate said in contact with said source diffusion region;
   c) a gate electrode positioned on said gate oxide layer and extending beyond the gate oxide layer to form a void space between the gate electrode and a portion of the substrate; and
   d) a sealing layer disposed between the gate electrode and a portion of said drain diffusion region to seal the void space and form a sealed void space between said gate electrode and the portion of the substrate,
   e) wherein said sealed void space lowers hot carrier injection induced effects in the transistor device.

2. The transistor device of claim 1, wherein each of the source and drain diffusion regions have lightly-doped drain (LDD) regions, one of the LDD regions positioned beneath the gate oxide layer and the other of the LDD regions positioned below said sealed void space.

3. The transistor device of claim 2, wherein said sealed void space is positioned over said substrate and a portion of the other of the LDD regions.

4. The transistor device of claim 2, wherein each of said source and drain diffusion regions are covered by a silicide layer and a spacer layer, the spacer layer surrounding the gate electrode so as to be positioned between respective said silicide layer and the gate electrode, the spacer layer positioned over a portion of the source diffusion layer and the LDD region and over a portion of the drain diffusion region and part of the other LDD region.

5. The transistor device of claim 4, wherein said spacer layer positioned over said drain diffusion region covers a portion of said sealed void space.

6. The transistor device of claim 1, wherein each of said source and drain diffusion regions are covered by a silicide layer and a spacer layer, the spacer layer surrounding the gate electrode so as to be positioned between a respective said silicide layer and the gate electrode, the spacer layer positioned over a portion of the source diffusion region and over a portion of the drain diffusion region.

7. The transistor device of claim 6, wherein said spacer layer positioned over said drain diffusion region covers a portion of said sealed void space.

8. The transistor device of claim 1, wherein said sealed void space is a vacuum having a lower dielectric constant than said gate oxide layer.

9. A method of reducing hot carrier injection damage in a transistor device comprising the steps of:
   a) forming a transistor device will a substrate, source diffusion region, drain diffusion region and a gate oxide layer positioned beneath a gate electrode;
   b) removing a portion of the gate oxide layer beneath said gate electrode and above a portion of the substrate to form a void space; and
   c) forming a sealing layer between the gate electrode and a portion of the drain diffusion region to seal the void space and form a sealed void space between the gate electrode and the portion of the substrate.

10. The method of clam 9, wherein said portion of said gate oxide layer is removed using a chemical etch.

11. The method of claim 10, wherein said chemical etch uses a hydrofluoric acid.

12. The method of claim 11, wherein said hydrofluoric acid is used in a range of a ratio of 100 parts water to one part hydrofluoric acid to 10 parts water to one part hydrofluoric acid.

13. The method of claim 10, wherein a mask is applied to said transistor device to expose a surface of said gate oxide layer and said surface is subjected to said chemical etch.

14. The method of claim 13, wherein a hydrofluoric acid is used as said chemical etch and any of said hydrofluoric acid remaining on said device after etching is removed by subjecting said transistor device to a vacuum at an elevated temperature.

15. The method of claim 9, wherein said void space contains one of a vacuum and an inert gas.

16. The method of claim 9, wherein said sealing layer comprises a material selected from the group consisting of an oxide and a nitride.

17. The method of claim 16, wherein said sealing layer has a thickness no greater than 1000 angstroms.

18. The method of claim 17, wherein the said thickness is about 500 angstroms.

19. The method of claim 16, wherein the step of forming a sealing layer is performed under a vacuum.

20. The method of claim 16, wherein said sealing layer covers an upper surface of said device.

* * * * *

UNITED STATES PATENT AND TRADEMARK OFFICE
CERTIFICATE OF CORRECTION

PATENT NO. : 5,864,160
DATED : January 26, 1999
INVENTOR(S) : Matthew S. Buynoski It is certified that error appears in the above-identified patent and that said Letters Patent is hereby corrected as shown below:

In the Claims:

Claim 1, Line 28, change "said" (first occurence) to -- and--;

Claim 4, Line 52, after "between" insert --a--;

Claim 9, Line 17, change "will" to --with--

Signed and Sealed this

Twentieth Day of July, 1999

Attest:

*Attesting Officer*

Q. TODD DICKINSON

*Acting Commissioner of Patents and Trademarks*